(12) United States Patent
Saiki et al.

(10) Patent No.: US 11,257,760 B2
(45) Date of Patent: Feb. 22, 2022

(54) SEMICONDUCTOR DEVICE HAVING METAL WIRE BONDED TO PLURAL METAL BLOCKS CONNECTED TO RESPECTIVE CIRCUIT PATTERNS

(71) Applicant: Mitsubishi Electric Corporation, Tokyo (JP)

(72) Inventors: Seiji Saiki, Fukuoka (JP); Masaru Furukawa, Fukuoka (JP); Takuro Mori, Fukuoka (JP); Takamasa Oda, Fukuoka (JP); Hideki Tsukamoto, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/991,230

(22) Filed: Aug. 12, 2020

(65) Prior Publication Data
US 2021/0143094 A1    May 13, 2021

(30) Foreign Application Priority Data
Nov. 13, 2019    (JP) .............................. JP2019-205233

(51) Int. Cl.
 *H01L 23/528* (2006.01)
 *H01L 23/31* (2006.01)
 *H01L 23/00* (2006.01)
(52) U.S. Cl.
 CPC ........ *H01L 23/528* (2013.01); *H01L 23/3121* (2013.01); *H01L 24/45* (2013.01)
(58) Field of Classification Search
 CPC .... H01L 23/528; H01L 23/3121; H01L 24/45

USPC .................................. 257/773; 438/618, 666
See application file for complete search history.

(56) References Cited

U.S. PATENT DOCUMENTS

| | | | |
|---|---|---|---|
| 9,412,679 B1* | 8/2016 | Nakahara | ................ H01L 24/37 |
| 2010/0013085 A1* | 1/2010 | Oi | ......................... H01L 25/072 257/693 |
| 2010/0133684 A1* | 6/2010 | Oka | ...................... H01L 25/072 257/712 |
| 2011/0298121 A1* | 12/2011 | Nishibori | .......... H01L 23/49861 257/713 |
| 2016/0343641 A1* | 11/2016 | Hori | ........................ H01L 24/11 |

FOREIGN PATENT DOCUMENTS

JP    2001-524735 A    12/2001

* cited by examiner

*Primary Examiner* — Didarul A Mazumder
(74) *Attorney, Agent, or Firm* — Studebaker & Brackett PC

(57) ABSTRACT

The semiconductor device includes a semiconductor element, a plurality of terminal electrodes, internal wiring, and a sealing material. The semiconductor element is mounted on a circuit pattern provided on an insulating substrate. The plurality of terminal electrodes are provided on a case in which the insulating substrate and the semiconductor element are contained. The internal wiring connects the semiconductor element and the plurality of terminal electrodes. The sealing material fills a space in the case. The internal wiring includes a plurality of circuit patterns, a plurality of metal blocks, and metal wire. The plurality of metal blocks are electrically connected to the respective circuit patterns. The metal wire connects the plurality of metal blocks and is bonded to the plurality of metal blocks at positions closer to an upper surface of the sealing material than surfaces of the plurality of circuit patterns.

10 Claims, 11 Drawing Sheets

F I G. 2
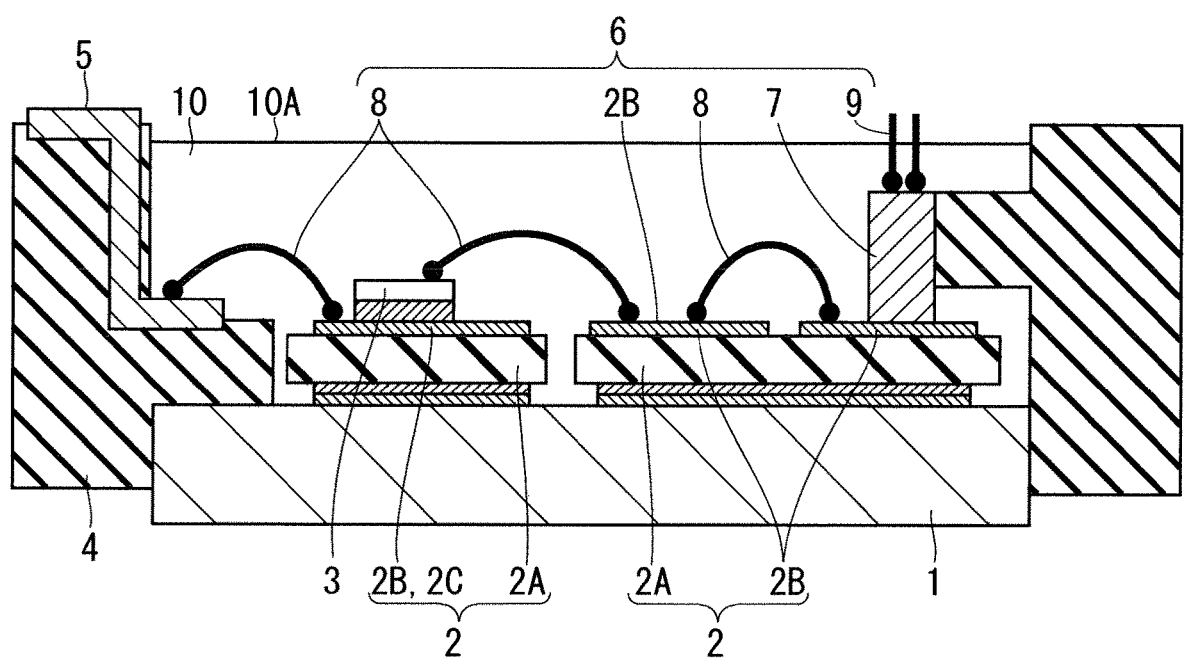

F I G. 3
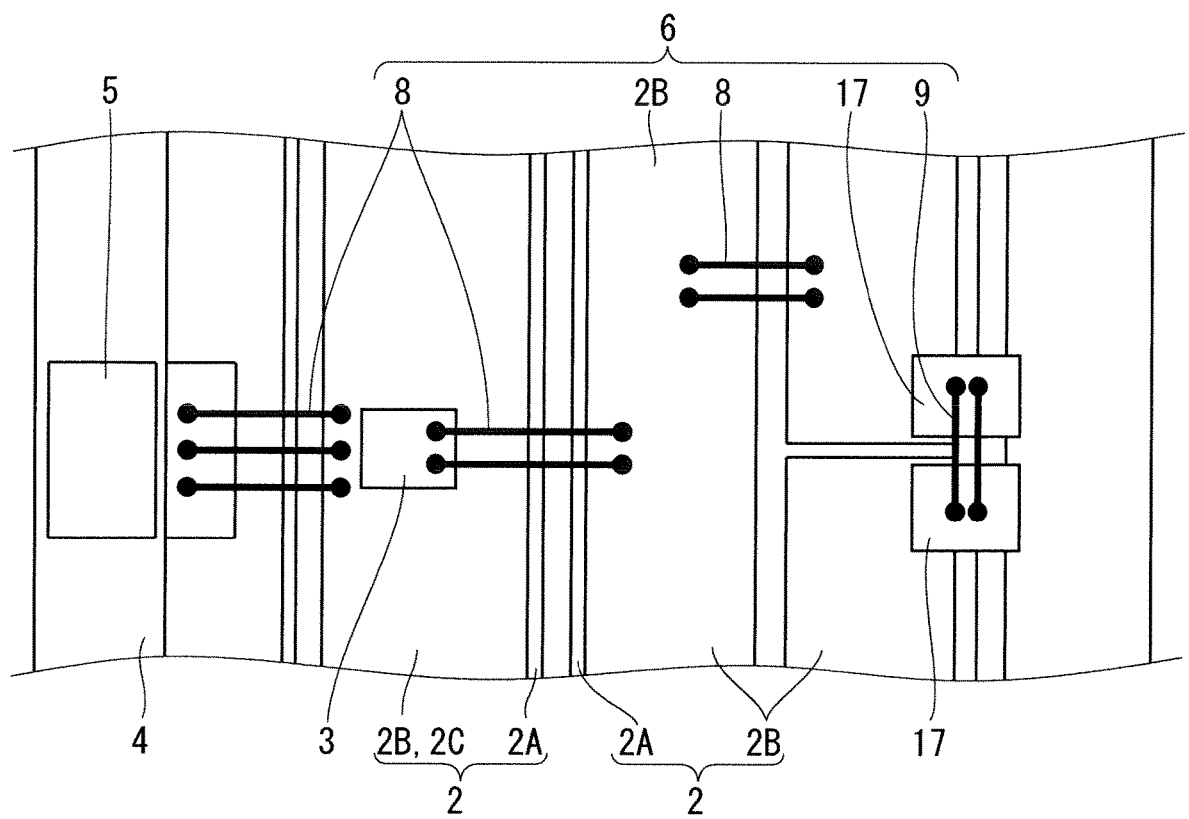

F I G. 4
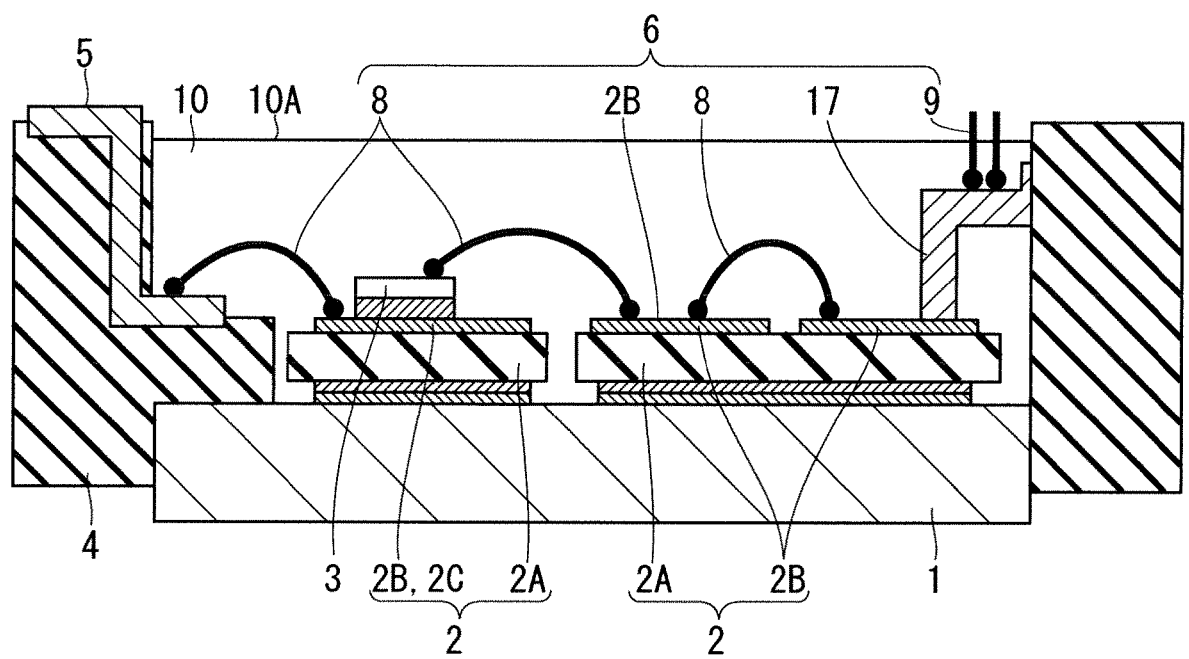

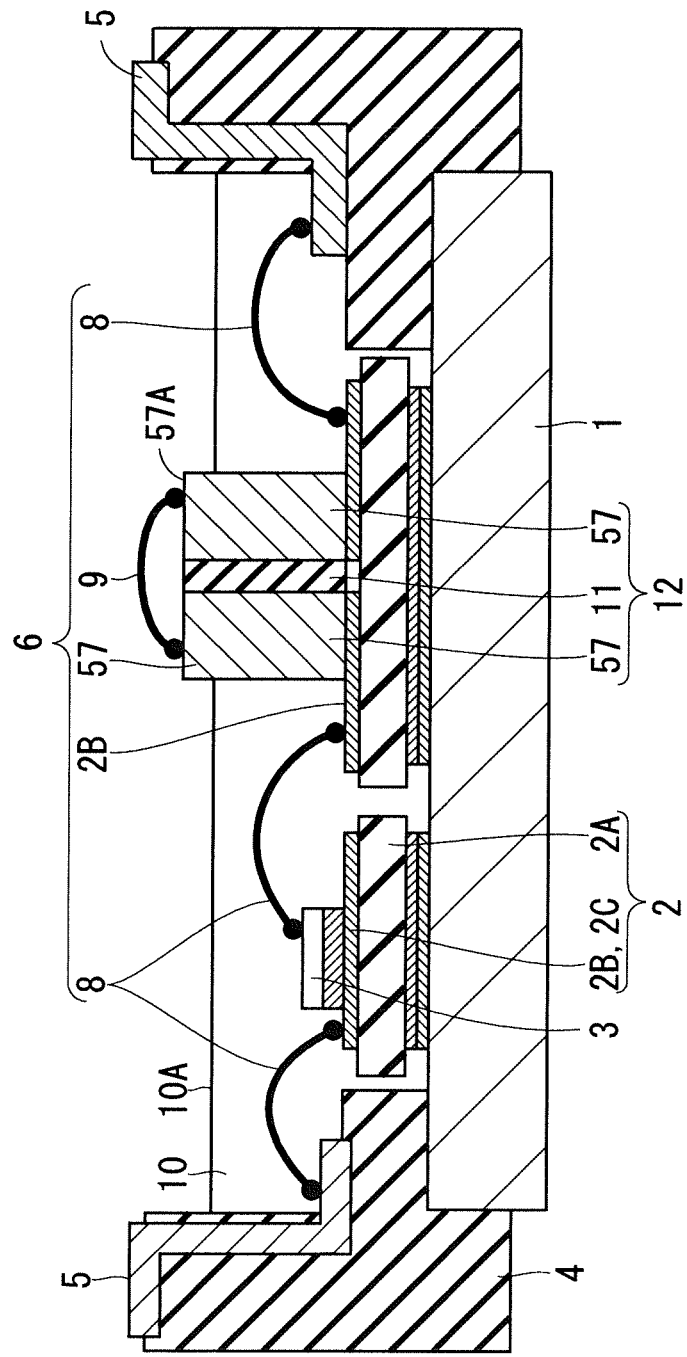

SEMICONDUCTOR DEVICE HAVING METAL WIRE BONDED TO PLURAL METAL BLOCKS CONNECTED TO RESPECTIVE CIRCUIT PATTERNS

BACKGROUND OF THE INVENTION

Field of the Invention

The present invention relates to a semiconductor device.

Description of the Background Art

A semiconductor device has an overcurrent protection function in order to prevent an overcurrent caused by a failure of a semiconductor chip. However, if the overcurrent protection function does not work and a secondary breakdown occurs, a large current flows through electrodes, wires, and a circuit pattern of a main circuit. As a technique for preventing such a situation and minimizing damage to the semiconductor device, a technique for providing a quick disconnection part inside the semiconductor device is known. The quick disconnection part is formed, for example, in a wire bonding part. When an overcurrent occurs, the wire bonding part is quickly fused and the overcurrent is cut off.

Japanese Unexamined Patent Application Publication (Translation of PCT Application) No. 2001-524735 discloses a semiconductor structure in which a bonding wire connecting a semiconductor substrate and an external connection part functions as a quick disconnection part. The bonding wire has a loop shape, and the apex of the loop is exposed on a surface of a press mass that is a sealing material. When an overcurrent flows, the loop exposed on the surface of the press mass melts.

In order to expose the wire on the surface of the sealing material, it is necessary to form a wire bonding part that is curved to a large degree, that is, a wire bonding part having a high loop shape. In a structure in which the height from a joining portion of a metal wire to a surface of a sealing material is high, it is difficult to stably form a loop shape of the metal wire.

SUMMARY

In order to solve the above problems, the present invention provides a semiconductor device in which a loop shape of a metal wire functioning as a quick disconnecting part is stably formed.

A semiconductor device according to the present invention includes a semiconductor element, a plurality of terminal electrodes, internal wiring, and a sealing material. The semiconductor element is mounted on one circuit pattern among a plurality of circuit patterns provided on at least one insulating substrate. The plurality of terminal electrodes are provided on a case in which the at least one insulating substrate and the semiconductor element are contained. The internal wiring connects the semiconductor element and the plurality of terminal electrodes. The sealing material fills a space in the case and seals the at least one insulating substrate and the semiconductor element. The internal wiring includes the plurality of circuit patterns, a plurality of metal blocks, and at least one metal wire. The plurality of metal blocks are electrically connected to the respective circuit patterns. The at least one metal wire connects the plurality of metal blocks. The at least one metal wire is bonded to the plurality of metal blocks at positions closer to an upper surface of the sealing material than surfaces of the plurality of circuit patterns.

According to the present invention, there is provided the semiconductor device in which a loop shape of a metal wire that functions as the quick disconnection part is stably formed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a cross-sectional view illustrating the configuration of the semiconductor device according to the first preferred embodiment;

FIG. 3 is a top view illustrating a configuration of a semiconductor device according to a second preferred embodiment;

FIG. 4 is a cross-sectional view illustrating the configuration of the semiconductor device according to the second preferred embodiment;

FIG. 11 is a cross-sectional view illustrating a configuration of a semiconductor device according to a seventh preferred embodiment.

DESCRIPTION OF THE PREFERRED EMBODIMENTS

First Preferred Embodiment

Figure 1:
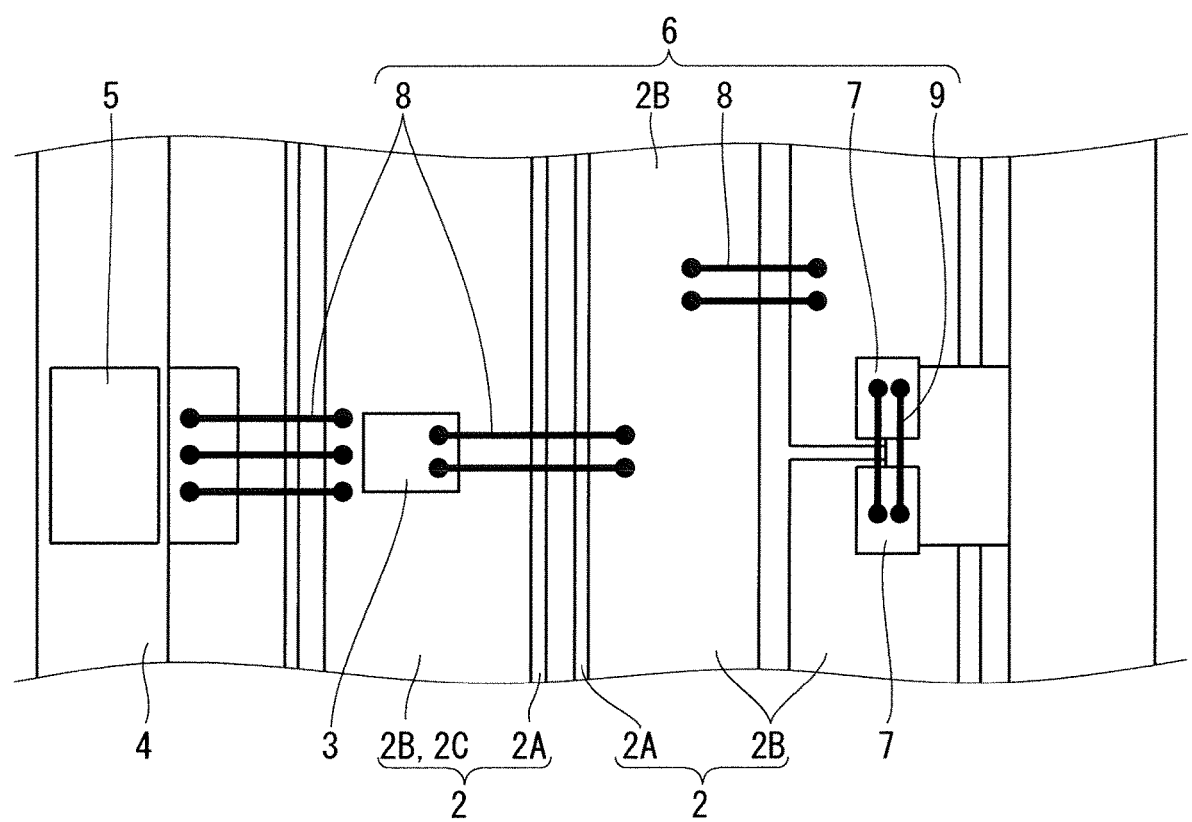
FIG. 1 is a top view illustrating a configuration of a semiconductor device according to a first preferred embodiment.

FIGS. 1 and 2 are a top view and a cross-sectional view illustrating a configuration of a semiconductor device according to the first preferred embodiment, respectively.

The semiconductor device includes a base plate 1, an insulating substrate 2, a semiconductor element 3, a case 4, terminal electrode 5, internal wiring 6, and a sealing material 10. In FIG. 1, illustration of the sealing material 10 is omitted.

The insulating substrate 2 is bonded to the base plate 1. The insulating substrate 2 includes a plate-shaped insulating member 2A and at least one circuit pattern 2B provided on a surface of the plate-shaped insulating member 2A. The semiconductor device according to the first preferred embodiment includes two insulating substrates 2, and the semiconductor device includes a plurality of circuit patterns 2B.

The semiconductor element 3 is mounted on one circuit pattern 2C among the plurality of circuit patterns 2B through a bonding material. The semiconductor element 3 is formed of, for example, a semiconductor such as Si or a so-called wide band gap semiconductor such as SiC or GaN. The semiconductor element 3 is, for example, an IGBT (Insulated Gate Bipolar Transistor), a MOSFET (Metal Oxide Semiconductor Field Effect Transistor), a Schottky barrier diode, or the like. The semiconductor element 3 is, for example, a power semiconductor element.

The case 4 has a frame shape in a plan view. The case 4 contains therein the insulating substrate 2 and the semiconductor element 3. The case 4 is made of resin, for example.

The terminal electrode 5 is provided on the case 4. Although only one terminal electrode 5 is illustrated in FIGS. 1 and 2, the semiconductor device includes two terminal electrodes (see FIG. 7, which will be described later). One terminal electrode is connected to a P side of the semiconductor element 3, and the other terminal electrode is connected to an N side of the semiconductor element 3. A part of the terminal electrode 5 is inserted in the case 4. In other words, the terminal electrode 5 is integrally fixed to the case 4. The terminal electrode 5 is a terminal for connecting to an external circuit.

The internal wiring 6 connects the semiconductor element 3 and each of the terminal electrodes 5. The internal wiring 6 includes the plurality of circuit patterns 2B, a plurality of metal blocks 7, a first metal wire 8, and a second metal wire 9 as circuit elements.

The plurality of metal blocks 7 are electrically connected to the respective circuit patterns 2B. In the first preferred embodiment, two metal blocks 7 are individually mounted on two circuit patterns 2B. For example, lower surfaces of the metal blocks 7 are bonded to the circuit patterns 2B through a bonding material. A part of each of the metal blocks 7 is inserted in the case 4. In other words, the metal blocks 7 are integrally fixed to the case 4. The metal blocks 7 are made of aluminum, gold, silver, copper, or an alloy thereof. A shape of the metal blocks 7 is not limited to a cube or a rectangular parallelepiped, and may be a round shape or a triangle.

The first metal wire 8 connects the terminal electrode 5 and the circuit pattern 2C, connects the semiconductor element 3 and the circuit pattern 2B, and connects the two circuit patterns 2B. As illustrated in FIG. 1, a plurality of first metal wires 8 may connect two circuit elements.

The second metal wire 9 connects the two metal blocks 7. As illustrated in FIG. 1, a plurality of second metal wires 9 may connect the two metal blocks 7. The second metal wire 9 is bonded to the metal blocks 7 at positions closer to an upper surface 10A of the sealing material 10 than a surface of the circuit pattern 2B. Both ends of the second metal wire 9 are bonded to upper surfaces of the respective two metal blocks 7.

A degree to which the second metal wire 9 is curved is smaller than a degree to which the first metal wire 8 is curved. Alternatively, a height from the upper surface of the metal block 7 to the apex of the second metal wire 9 is lower than a height from a surface of a circuit element to which the first metal wire 8 is bonded to the apex of the first metal wire 8.

Current squared time ($I^2t$) of the second metal wire 9 is smaller than current squared time of the circuit pattern 2B and the first metal wire 8. Therefore, the second metal wire 9 is easier to fuse than the first metal wire 8. That is, the second metal wire 9 forms a quick disconnection part. Such a configuration is realized, for example, by adjusting the number of parallel connections, the wire diameters, the wire lengths, and the like of the first metal wire 8 and the second metal wire 9.

The sealing material 10 fills a space inside the frame shape of the case 4 and seals mounted components such as the insulating substrate 2 and the semiconductor element 3.

As described above, the semiconductor device includes at least one second metal wire 9 having smaller current squared time than those of the first metal wire 8 and the circuit pattern 2B. In other words, the internal wiring 6 includes one or more parts having current squared time smaller than the current squared time of the first metal wire 8 and the circuit pattern 2B. When the overcurrent protection function does not work and a secondary breakdown occurs, the second metal wire 9 is quickly fused, and thus the semiconductor device and a semiconductor module including the semiconductor device are prevented from being destroyed.

In summary, the semiconductor device according to the first preferred embodiment includes the semiconductor element 3, the plurality of terminal electrodes 5, the internal wiring 6, and the sealing material 10. The semiconductor element 3 is mounted on one circuit pattern 2C among the plurality of circuit patterns 2B provided on at least one insulating substrate 2. The plurality of terminal electrodes 5 are provided on the case 4 in which at least one insulating substrate 2 and the semiconductor element 3 are contained. The internal wiring 6 connects the semiconductor element 3 and the plurality of terminal electrodes 5. The sealing material 10 fills a space in the case 4 and seals at least one insulating substrate 2 and the semiconductor element 3. The internal wiring 6 includes the plurality of circuit patterns 2B, the plurality of metal blocks 7, and at least one metal wire (the second metal wire 9). The plurality of metal blocks 7 are electrically connected to the respective circuit patterns 2B. At least one second metal wire 9 connects the plurality of metal blocks 7. At least one second metal wire 9 is bonded to the plurality of metal blocks 7 at positions closer to the upper surface 10A of the sealing material 10 than the surfaces of the plurality of circuit patterns 2B.

In such a semiconductor device, points at which the second metal wire 9 is connected, that is, positions where the second metal wire 9 is bonded to the metal blocks 7 are close to the upper surface 10A of the sealing material 10. Even in a case where a distance from the circuit pattern 2B to the surface of the sealing material 10 is large, the second metal wire 9 has a loop shape having a gentle curve. It is easy to form such a gentle loop shape. In other words, the loop shape of the second metal wire 9 that functions as a quick disconnection part is stably formed. It also becomes easy to identify a part broken due to overcurrent.

Furthermore, the plurality of metal blocks 7 of the semiconductor device according to the first preferred embodiment are integrally fixed to the case 4 and are mounted on the plurality of circuit patterns 2B, and thus the plurality of metal blocks 7 are electrically connected to the plurality of circuit patterns 2B. Both ends of at least one second metal wire 9 are bonded to the upper surfaces of the respective metal blocks 7.

With such a configuration, in a manufacturing process of the semiconductor device, positions of the metal blocks 7 with respect to the circuit patterns 2B are automatically determined by mounting the case 4 at a predetermined position with respect to the base plate 1 on which the insulating substrate 2 has been mounted. This makes it easy to assemble the semiconductor device.

Second Preferred Embodiment

A semiconductor device according to the second preferred embodiment will be described below. The second preferred embodiment is a subordinate concept of the first preferred embodiment, and the semiconductor device according to the second preferred embodiment includes the constituent elements of the semiconductor device according to the first preferred embodiment. Note that description of configuration and operation similar to those of the first preferred embodiment will be omitted.

FIGS. 3 and 4 are a top view and a cross-sectional view illustrating a configuration of the semiconductor device according to the second preferred embodiment, respectively. A shape of metal blocks 17 of the semiconductor device according to the second preferred embodiment is different from the shape of the metal blocks 7 according to the first preferred embodiment. The metal blocks 17 have a crank shape in a cross-sectional view. A part of each of the crank-shaped metal blocks 17 is inserted into the case 4. In other words, the metal blocks 17 are integrally fixed to the case 4.

With such a configuration, a loop shape of the second metal wire 9 functioning as a quick disconnection part is stably formed. Furthermore, in a manufacturing process of the semiconductor device, positions of the metal blocks 17 with respect to the circuit patterns 2B are automatically determined by mounting the case 4 at a predetermined position on the base plate 1 on which the insulating substrate 2 has been mounted. This makes it easy to assemble the semiconductor device.

Third Preferred Embodiment

A semiconductor device according to the third preferred embodiment will be described below. The semiconductor device according to the third preferred embodiment includes the constituent elements of the semiconductor device according to the first preferred embodiment. Note that description of configuration and operation similar to those of the first or second preferred embodiment will be omitted.

Figure 5:
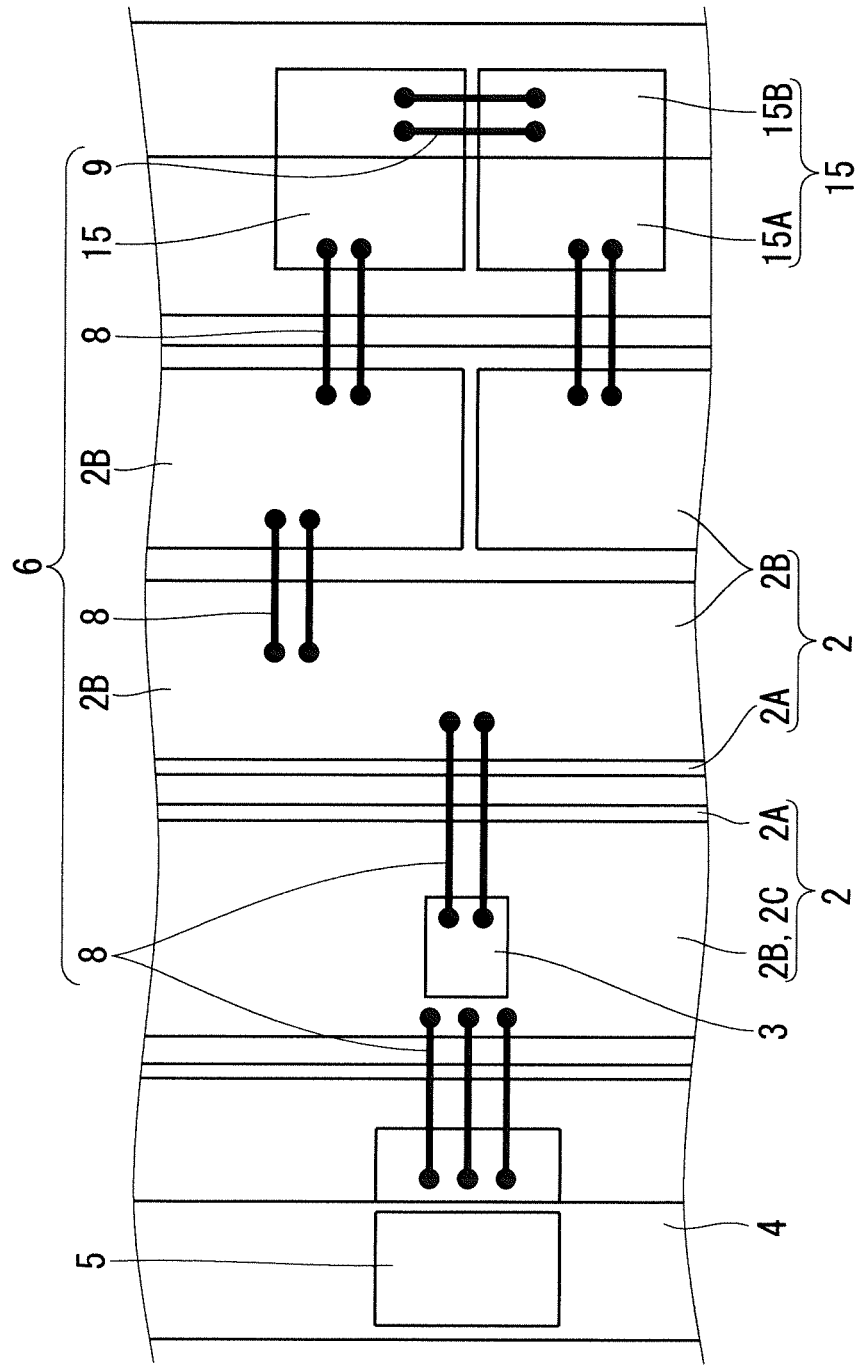
FIG. 5 is a top view illustrating a configuration of a semiconductor device according to a third preferred embodiment.
Figure 6:
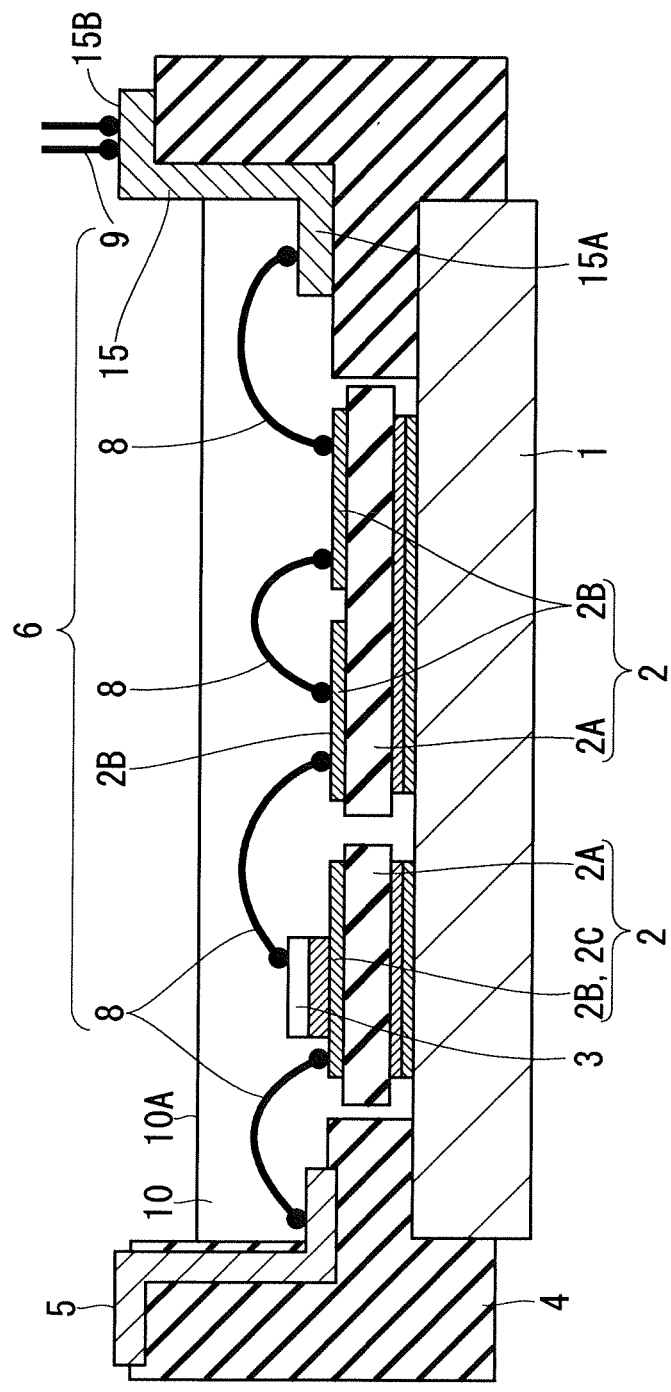
FIG. 6 is a cross-sectional view illustrating the configuration of the semiconductor device according to the third preferred embodiment.

FIGS. 5 and 6 are a top view and a cross-sectional view illustrating a configuration of the semiconductor device according to the third preferred embodiment, respectively. A configuration of metal blocks of the semiconductor device according to the third preferred embodiment is different from that of the first preferred embodiment.

The plurality of metal blocks according to the third preferred embodiment are a plurality of terminal electrodes 15. That is, the terminal electrodes 15 have the functions of the metal blocks 7 in the first preferred embodiment. Specifically, two terminal electrodes 15 illustrated on the right side in FIG. 5 have the functions of the two metal blocks 7. The two terminal electrodes 15 are connected to one polarity of the semiconductor element 3. The terminal electrode 5 illustrated on the left side in FIG. 5 is connected to the other polarity of the semiconductor element 3 and does not have the functions of the metal blocks 7.

A part of each of the two terminal electrodes 15 having the functions of the metal blocks 7 is inserted into the case 4. In other words, the terminal electrodes 15 are integrally fixed to the case 4. Lower parts 15A of the terminal electrodes 15 are connected to circuit patterns 2B by first metal wires 8. Upper surfaces 15B of the terminal electrodes 15 are located higher than the upper surface 10A of the sealing material 10. The upper surfaces 15B of the terminal electrodes 15 are provided on an upper surface of the case 4. Both ends of the second metal wire 9 are bonded to the upper surfaces 15B of the respective two terminal electrodes 15.

With such a configuration, a loop shape of the second metal wire 9 functioning as a quick disconnection part is stably formed. Furthermore, in a manufacturing process of the semiconductor device, positions of the metal blocks 7, that is, positions of the terminal electrodes 15 with respect to the circuit patterns 2B are automatically determined by mounting the case 4 at a predetermined position on the base plate 1 on which the insulating substrate 2 has been mounted. Furthermore, the lower parts 15A of the terminal electrodes 15 and the circuit patterns 2B can be connected to each other by the first metal wires 8, and furthermore, the two terminal electrodes 15 can be connected to each other by the second metal wire 9 even after filling of the sealing material 10. This makes it easy to assemble the semiconductor device.

Fourth Preferred Embodiment

A semiconductor device according to the fourth preferred embodiment will be described below. The semiconductor device according to the fourth preferred embodiment includes the constituent elements of the semiconductor device according to the first preferred embodiment. Note that description of configuration and operation similar to those in any of the first to third preferred embodiments will be omitted.

Figure 7:
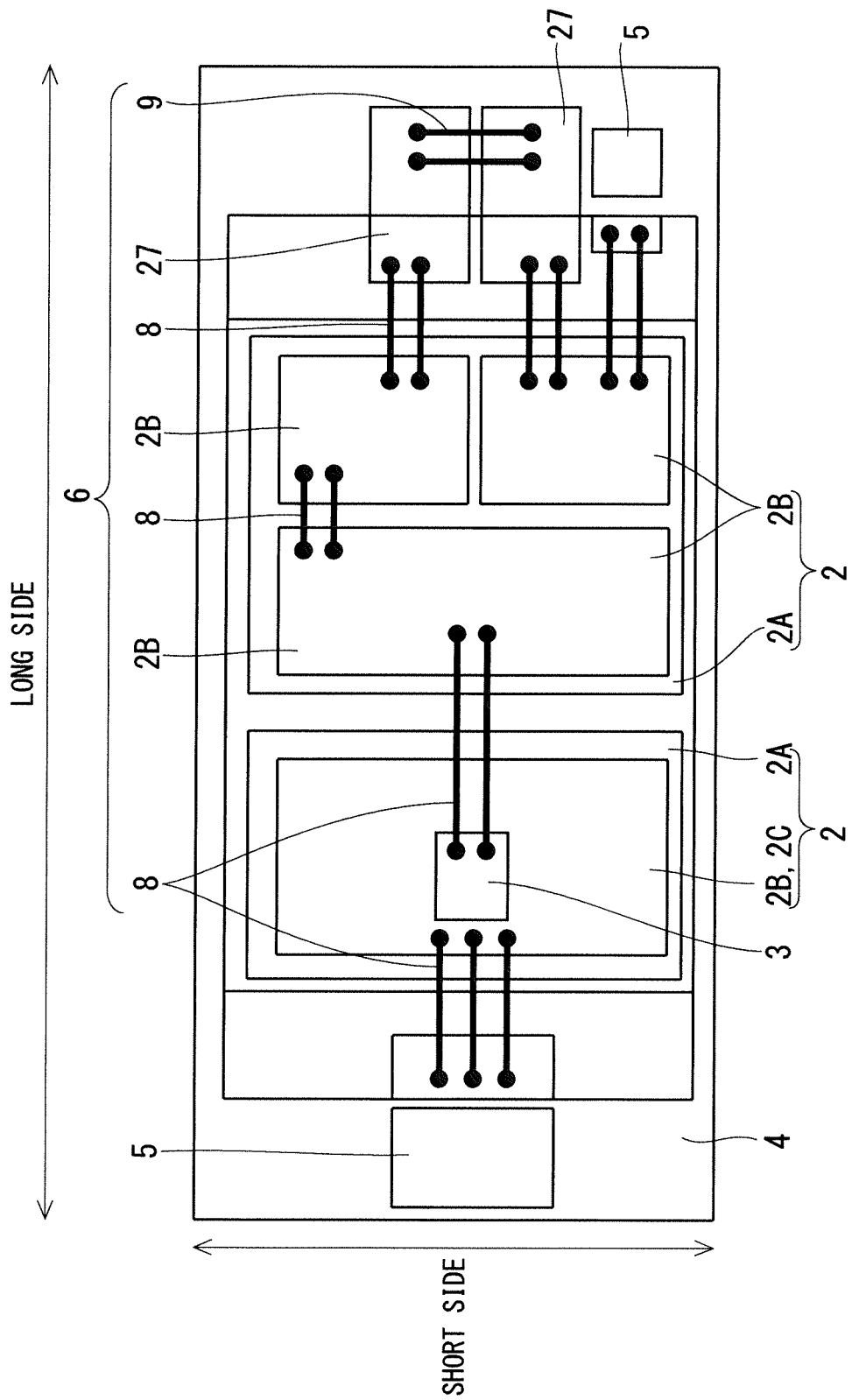
FIG. 7 is a top view illustrating a configuration of a semiconductor device according to a fourth preferred embodiment.

FIG. 7 is a top view illustrating a configuration of the semiconductor device according to the fourth preferred embodiment.

The case 4 has a rectangular planar shape, and specifically has a rectangular frame shape in a plan view. A frame of a short side is wider than a frame of a long side.

The terminal electrodes 5 and metal blocks 27 are provided on the short sides of the case 4. A part of each of the terminal electrodes 5 and the metal blocks 27 is inserted into the case 4. In other words, the terminal electrodes 5 and the metal blocks 27 are integrally fixed to the case 4. Lower part of each of the terminal electrodes 5 and the metal blocks 27 is connected to the circuit pattern 2B by the first metal wires 8.

Upper surfaces of the metal blocks 27 are located higher than the upper surface 10A of the sealing material 10. The upper surfaces of the metal blocks 27 are provided on the upper surface of the case 4. Both ends of the second metal wire 9 are bonded to the upper surfaces of the respective two metal blocks 27.

Such a configuration can reduce an entire shape of the case 4, thereby preventing an increase in size of the semiconductor device.

Fifth Preferred Embodiment

A semiconductor device according to a fifth preferred embodiment will be described below. The semiconductor device according to the fifth preferred embodiment includes the constituent elements of the semiconductor device according to the first preferred embodiment. Note that description of configuration and operation similar to those in any of the first to fourth preferred embodiments is omitted.

Figure 8:
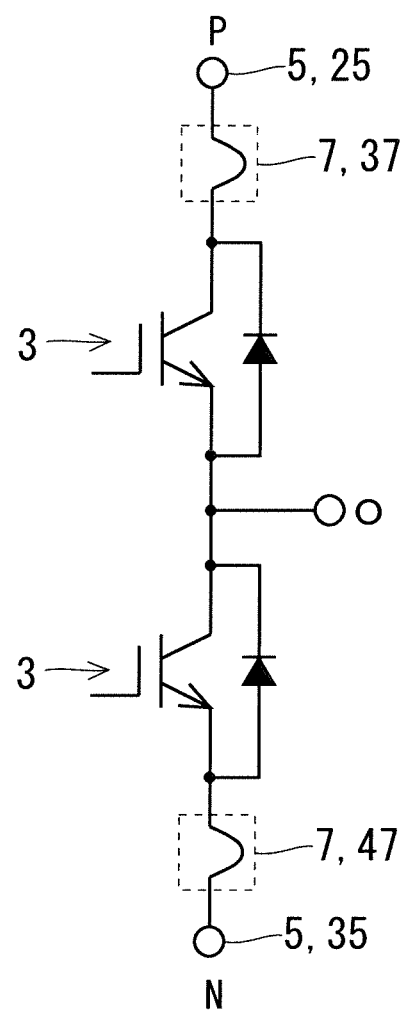
FIG. 8 is a circuit diagram illustrating a configuration of a semiconductor device according to a fifth preferred embodiment.
Figure 9:
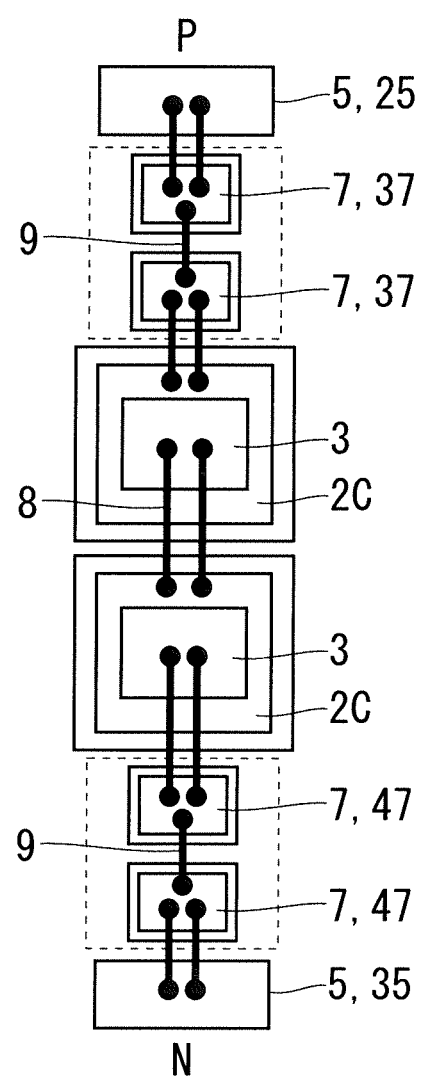
FIG. 9 is a diagram illustrating a configuration of a semiconductor device corresponding to the circuit diagram illustrated in FIG. 8.

FIG. 8 is a circuit diagram illustrating a configuration of the semiconductor device according to the fifth preferred embodiment. FIG. 9 illustrates a configuration of the semiconductor device corresponding to the circuit diagram illustrated in FIG. 8.

The semiconductor device includes two semiconductor elements 3, a first terminal electrode 25, and a second terminal electrode 35. The two semiconductor elements 3 are individually mounted on two circuit patterns 2C and are connected in series with each other by the first metal wire 8.

The first terminal electrode 25 is connected to a P side of the semiconductor elements 3, and the second terminal electrode 35 is connected to an N side of the semiconductor elements 3.

The plurality of metal blocks 7 include a plurality of first metal blocks 37 provided between the first terminal electrode 25 and the semiconductor elements 3. The plurality of metal blocks 7 further include a plurality of second metal blocks 47 provided between the second terminal electrode 35 and the semiconductor elements 3. In this example, two first metal blocks 37 and two second metal blocks 47 are provided. As described above, the plurality of metal blocks 7 according to the fifth preferred embodiment are disposed on both of the P side and the N side of semiconductor elements 3.

The two first metal blocks 37 are connected to each other by a second metal wire 9, and the two second metal blocks 47 are connected to each other by a second metal wire 9.

With such a configuration, short circuit breakdown or ground fault breakdown is prevented. Although an example in which the plurality of metal blocks 7 are disposed on both of the P side and the N side of the semiconductor elements 3 has been described above, a plurality of terminal electrodes 15 having functions of the metal blocks 7 may be disposed on both of the P side and the N side of the semiconductor elements 3, as described in the third preferred embodiment. Similar effects are also produced in such a case.

Sixth Preferred Embodiment

A semiconductor device according to the sixth preferred embodiment will be described below. The semiconductor device according to the sixth preferred embodiment includes the constituent elements of the semiconductor device according to the first preferred embodiment. Note that description of configuration and operation similar to those in any of the first to fifth embodiments will be omitted.

Figure 10:
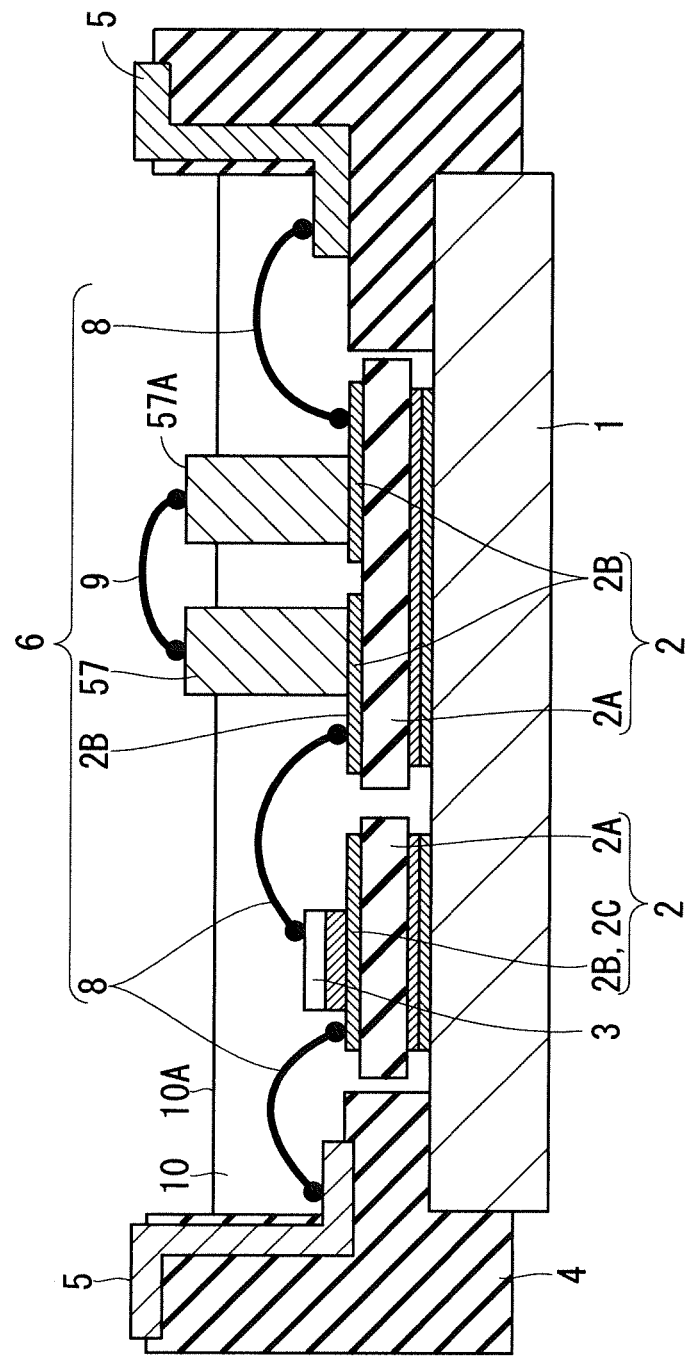
FIG. 10 is a cross-sectional view illustrating a configuration of a semiconductor device according to a sixth preferred embodiment.

FIG. 10 is a cross-sectional view illustrating a configuration of the semiconductor device according to the sixth preferred embodiment.

Upper surfaces 57A of metal blocks 57 protrude above the upper surface 10A of the sealing material 10. In other words, the metal blocks 57 have a height such that the upper surfaces 57A are located higher than the upper surface 10A of the sealing material 10. Both ends of the second metal wire 9 are bonded to the upper surfaces 57A of the metal blocks 57.

With such a configuration, a loop shape of the second metal wire 9 functioning as a quick disconnection part is stably formed. Furthermore, in a manufacturing process of the semiconductor device, a step of connecting the metal blocks 57 by the second metal wire 9 after filling of the sealing material 10, that is, a post-wire bonding step can be realized. This makes it easy to assemble the semiconductor device.

Seventh Preferred Embodiment

A semiconductor device according to the seventh preferred embodiment will be described below. The semiconductor device according to the seventh preferred embodiment includes the constituent elements of the semiconductor device according to the first preferred embodiment. Note that description of configuration and operation similar to those in any of the first to sixth preferred embodiments will be omitted.

FIG. 11 is a cross-sectional view illustrating a configuration of the semiconductor device according to the seventh preferred embodiment.

As in the sixth preferred embodiment, the upper surfaces 57A of the metal blocks 57 protrude above the upper surface 10A of the sealing material 10. In the seventh preferred embodiment, an insulating material 11 is further provided between the two metal blocks 57. The insulating material 11 connects the two metal blocks 57. Both ends of the second metal wire 9 are bonded to the upper surfaces 57A of the metal blocks 57. In a manufacturing process, a component prepared in advance by coupling the two metal blocks 57 with use of the insulating material 11, that is, a coupled block 12, which is a semi-finished product, may be bonded onto the circuit pattern 2B. Furthermore, the second metal wire 9 may be bonded to the two metal blocks 57 before the coupled block 12 is bonded onto the circuit pattern 2B.

With such a configuration, a loop shape of a second metal wire 9 functioning as a quick disconnection part is stably formed. Furthermore, in the manufacturing process of the semiconductor device, a step of putting the sealing material 10 after connecting the coupled block 12 with use of the second metal wire 9, that is, a pre-wire bonding step can be realized. This makes it easy to assemble the semiconductor device. Furthermore, in a case where the insulating material 11 is thin, a distance between the two metal blocks 57 becomes short and wiring inductance (Ls) becomes small.

Eighth Preferred Embodiment

A semiconductor device according to the eighth preferred embodiment will be described below. The semiconductor device according to the eighth preferred embodiment includes the constituent elements of the semiconductor device according to the first preferred embodiment. Note that description of configuration and operation similar to those in any of the first to seventh preferred embodiments will be omitted.

The semiconductor element 3 is a switching element or a diode element as described above. The semiconductor element 3 may be made of silicon (Si), but is preferably made of a wide band gap semiconductor having a band gap larger than that of silicon. The wide band gap semiconductor is, for example, a material containing silicon carbide (SiC) or gallium nitride (GaN). Alternatively, the wide band gap semiconductor is, for example, diamond.

The switching element and the diode element formed of the wide band gap semiconductor is high in withstand voltage, allowable current density, and heat resistance and is low in power loss.

The high withstand voltage and high allowable current density allow a reduction in size of the switching element and the diode element, thereby allowing a reduction in size of the semiconductor module incorporating the switching element or the diode element.

The high heat resistance allows a reduction in size of a heat radiation fin of a heat sink, thereby allowing a further reduction in size of the semiconductor module.

The low power loss allows an improvement in efficiency of the switching element and the diode element, thereby allowing an improvement in efficiency of the semiconductor module.

Both of the switching element and the diode element are preferably made of the wide band gap semiconductor, but either one of the switching element and the diode element may be made of the wide band gap semiconductor. Even with such a configuration, the effects described in the above preferred embodiments can be obtained.

The embodiments of the present invention can be freely combined and changed or omitted as appropriate within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a semiconductor element mounted on one circuit pattern among a plurality of circuit patterns provided on at least one insulating substrate;
    a plurality of terminal electrodes provided on a case in which the at least one insulating substrate and the semiconductor element are contained;
    internal wiring connecting the semiconductor element and the plurality of terminal electrodes; and
    a sealing material filling a space in the case and sealing the at least one insulating substrate and the semiconductor element, wherein
    the internal wiring include
        the plurality of circuit patterns,
        a plurality of metal blocks electrically connected to respective circuit patterns of the plurality of circuit patterns, and
        at least one metal wire connecting the plurality of metal blocks, and
    the at least one metal wire is bonded to the plurality of metal blocks at positions closer to an upper surface of the sealing material than surfaces of the plurality of circuit patterns.

2. The semiconductor device according to claim 1, wherein
    the plurality of metal blocks is integrally fixed to the case, mounted on the plurality of circuit patterns, and electrically connected to the plurality of circuit patterns, and
    both ends of the at least one metal wire are bonded to respective upper surfaces of the plurality of metal blocks.

3. The semiconductor device according to claim 2, wherein each of the plurality of metal blocks has a crank shape.

4. The semiconductor device according to claim 1, wherein
    the plurality of terminal electrodes is integrally fixed to the case,
    the plurality of metal blocks is the plurality of terminal electrodes, and
    both ends of the at least one metal wire are bonded to upper surfaces of the respective terminal electrodes.

5. The semiconductor device according to claim 1, wherein
    the case has a rectangular planar shape, and
    the plurality of metal blocks is provided on a short side of the case.

6. The semiconductor device according to claim 1, wherein
    the plurality of terminal electrodes includes
        a first terminal electrode connected to a P side of the semiconductor element and
        a second terminal electrode connected to an N side of the semiconductor element,
    the plurality of metal blocks includes
        a plurality of first metal blocks provided between the first terminal electrode and the semiconductor element and
        a plurality of second metal blocks provided between the second terminal electrode and the semiconductor element, and
    the at least one metal wire is a plurality of metal wires including a metal wire connecting the plurality of first metal blocks and a metal wire connecting the plurality of second metal blocks.

7. The semiconductor device according to claim 1, wherein upper surfaces of the plurality of metal blocks to which the at least one metal wire is bonded each protrude above the upper surface of the sealing material.

8. The semiconductor device according to claim 1, wherein the plurality of metal blocks is coupled by an insulating material.

9. The semiconductor device according to claim 1, wherein the semiconductor element contains SiC.

10. The semiconductor device according to claim 1, wherein current squared time of the at least one metal wire is smaller than current squared time of each of the plurality of circuit patterns.

* * * * *